Jan. 5, 1971 G. M. EDGE 3,553,609

ACTIVE CAPACITANCE REACTANCE CIRCUIT

Filed April 15, 1968

INVENTOR
GORDON MALCOLM EDGE
BY Cushman, Darby & Cushman
ATTORNEYS

United States Patent Office 3,553,609

Patented Jan. 5, 1971

3,553,609

ACTIVE CAPACITANCE REACTANCE CIRCUIT

Gordon Malcolm Edge, Cambridge, England, assignor to Cambridge Consultants Limited, Cambridge, England, a British company Filed Apr. 15, 1968, Ser. No. 721,414
Claims priority, application Great Britain, Apr. 21, 1967, 18,435/67
Int. Cl. H03h *11/00*
U.S. Cl. 333—80 4 Claims

ABSTRACT OF THE DISCLOSURE

A variable impedance circuit including a constant current generator connected in series with an active circuit element having feedback provided by a reactive element, and means to vary the gain of the active element.

This invention relates to an electrical circuit arrangement by means of which it is possible to vary the effective value of reactance provided by the circuit by varying a voltage applied to the circuit.

According to the present invention there is provided an electrical circuit including an active circuit element connected in series with a constant current generator, a reactive element connected to provide feedback between the output and the input of the active element and means to vary the gain of the active element whereby the effective impedance presented at an output of the circuit may be varied.

Figure 1:
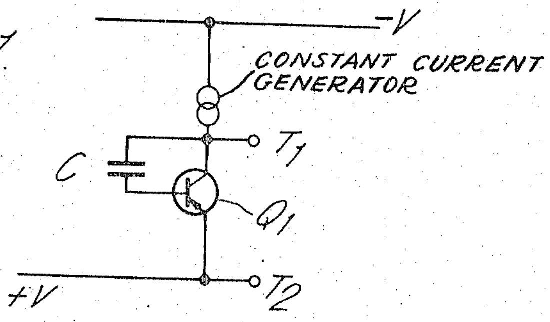
Figure 2:
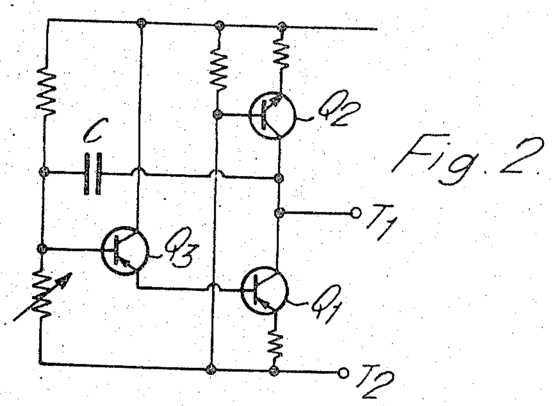
Figure 3:
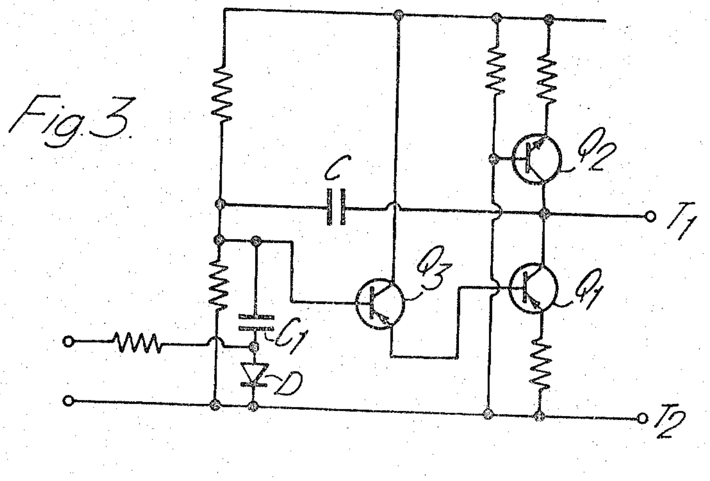

The invention will now be described with reference to the accompanying drawings, in which:

FIG. 1 shows a basic circuit which illustrates the principle of the present invention, FIG. 2 shows a more detailed practical circuit arrangement, and FIG. 3 shows a circuit which is a modification of that shown in FIG. 2.

Referring to FIG. 1 there is shown an active circuit element which is provided by a pnp junction transistor $Q_1$ having its collector current supplied via a constant current generator $I_g$. A feedback capacitor C is connected between the collector and the base of the transistor $Q_1$. The output terminals $T_1$ and $T_2$ of the circuit are thus effectively connected to a capacitor shunted by a resistor. The nominal value of capacitance provided at the output terminals is related both to the capacitance of the feedback capacitor C and to the gain of the active circuit element $Q_1$, and the value of capacitance appearing at the output terminals can by varied by varying the potential applied to the base of the transistor $Q_1$ and thus its gain. Two possible ways of varying the potential applied to the base of transistor $Q_1$ are disclosed in the practical circuit arrangements of FIGS. 2 and 3 described below.

Referring to FIG. 2 there is shown an arrangement in which the transistor $Q_1$ is connected via a transistor $Q_2$ which is arranged to supply a constant current to the transistor $Q_1$. The feedback capacitor C is connected in a feedback path which includes a transistor $Q_3$. The transistor $Q_3$ is connected in a common collector configuration so as to increase the effective gain of the active device $Q_1$ by presenting a high impedance to the feedback capacitor C. The gain of the active element $Q_1$ may be varied by varying a potential applied between the base of the transistor $Q_3$ and the terminal $T_2$.

The constant current generator $Q_2$ maintains a very high effective shunt resistance which enables the circuit to be employed in a wide variety of applications with a minimum of effect on any associated circuit.

It can be shown that the ratio of the value of the change in output voltage at the terminals $T_1$ and $T_2$ to the change in effective value of capacitance across the terminals $T_1$ and $T_2$ is equal to $1/k(jwc)$ where $k$ is a constant related to parameters of the circuit elements used and $1/jwc$ is the reactance of the capacitor C. The effective value of capacitance across the terminals $T_1$ and $T_2$ is therefore $k$ times the value of the capacitor C. The constant $k$ includes a factor related to the amplification factor of the transistor $Q_1$ so that variations of the amplification provided by the transistor $Q_1$ effectively varies the value of capacitance seen across the terminals $T_1$ and $T_2$.

Referring to FIG. 3 there is shown a modification of the circuit of FIG. 2 and including a capicitor $C_1$ and a diode D. A bias voltage applied across the diode D may be used to vary the forward impedance of the diode D and thus the amplification characteristic of the circuit. It is, of course, necessary that any feedback current flowing via the capacitor $C_1$ to the diode D is small compared with the mean current through the diode.

The effective gain of the circuit is controlled by the modification of the effective A.C. base currents to the transistors $Q_3$ and $Q_1$ by variations in the impedance of the diode $D_1$. The capacitor $C_1$ isolates the circuit consisting of the transistors $Q_1$, $Q_2$ and $Q_3$ from the control voltage across the diode D. The value of the capacitor $C_1$ must be large compared with that of the feedback capacitor C.

There is thus described a circuit by means of which it is possible to simulate a capacitor, which is variable in value according to variations in an external voltage and which is shunted by a fixed resistive component large compared with the capacitor impedance to be simulated.

I claim:

1. An active capacitance reactance circuit comprising, in combination, a first active circuit element, an output and an input to said first active circuit element, a constant current generator including a fixedly biased further active circuit element connected in series with said output, a capacitive reactive element connected electrically to said output and said input, a second active circuit element connected to said capacitive reactive element and to said input in such a manner as to present a high impedance to the capacitive reactive element, an input to said second active circuit element, and means for potential varying the effective output impedance presented at said output including bias voltage supply terminals, variable impedance means connected between said supply terminals and a capacitor connected between said input to said second active circuit element and one of said bias voltage supply terminals so that variation in the potential applied between said bias terminals varies the impedance of said variable impedance means and accordingly said output impedance.

2. An active capacitance reactance circuit as claimed in claim 1, wherein said impedance means is a semiconductor device having at least two terminals, the impedance between which terminals can be varied, connected between the bias voltage supply terminals and in series with said capacitor.

3. An active capacitance reactance circuit as claimed in claim 2, in which said semiconductor device comprises a diode.

4. An active capacitance reactance circuit as claimed in claim 1, further comprising a diode connected between the bias voltage terminals and in series with said capacitor, and in which the first and second active elements are, respectively, first and second transistors of one conductivity type and the further active element is a further transistor of opposite conductivity type to said one conductivity type, base, emitter and collector electrodes of each of said transistors, the collector electrodes of said first and further transistors being connected together to constitute said output, said capacitive reactive element is connected to the base electrode of the second transistor, and in which the emitter of the second transistor is connected to the base electrode of the first transistor.

References Cited

UNITED STATES PATENTS

| | | | |
|---|---|---|---|
| 2,870,421 | 1/1959 | Goodrich | 333—80(T) |
| 2,948,869 | 8/1960 | Bigelow | 333—80(T) |
| 3,152,309 | 10/1964 | Bogusz et al. | 333—80 |
| 3,289,119 | 11/1966 | Josephs | 333—80(T) |
| 2,972,120 | 2/1961 | Kireher et al. | 331—180X |
| 3,260,960 | 7/1966 | Bangert | 331—177X |

HERMANN KARL SAALBACH, Primary Examiner

P. L. GENSLER, Assistant Examiner

U.S. Cl. X.R.

307—295